US008676282B2

(12) United States Patent
Jiang et al.

(10) Patent No.: US 8,676,282 B2
(45) Date of Patent: Mar. 18, 2014

(54) SUPERCONDUCTING MAGNET COIL SUPPORT WITH COOLING AND METHOD FOR COIL-COOLING

(75) Inventors: Longzhi Jiang, Florence, SC (US); Clifford Ginfrida, Jr., Florence, SC (US); Neil Clarke, Oxford (GB); Weijun Shen, Florence, SC (US); Ernst Wolfgang Stautner, Niskayuna, NY (US); Tao Zhang, Niskayuna, NY (US); Robbi McDonald, Florence, SC (US)

(73) Assignee: General Electric Company, Schenectady, NY (US)

( * ) Notice: Subject to any disclaimer, the term of this patent is extended or adjusted under 35 U.S.C. 154(b) by 594 days.

(21) Appl. No.: 12/915,585

(22) Filed: Oct. 29, 2010

(65) Prior Publication Data
US 2012/0108433 A1    May 3, 2012

(51) Int. Cl.
*H01F 6/06*    (2006.01)
*H01F 6/04*    (2006.01)
*F28D 7/00*    (2006.01)

(52) U.S. Cl.
USPC ........... 505/163; 505/825; 505/888; 505/892; 62/51.1; 62/45.1; 165/157

(58) Field of Classification Search
USPC ............... 505/162, 163, 885, 892, 825, 888; 324/315, 318, 319; 335/216, 296–301; 62/50.1, 50.7, 51.1, 465, 45.1; 165/157, 699, 299
See application file for complete search history.

(56) References Cited

U.S. PATENT DOCUMENTS

| | | | |
|---|---|---|---|
| 4,726,199 A | 2/1988 | Takano et al. | |
| 5,304,934 A | 4/1994 | Laskaris et al. | |
| 5,513,498 A * | 5/1996 | Ackermann et al. | ........... 62/51.1 |
| 7,015,692 B2 | 3/2006 | Clarke et al. | |
| 7,250,766 B2 | 7/2007 | Morita et al. | |
| 7,260,941 B2 | 8/2007 | van Hasselt | |
| 7,301,343 B1 | 11/2007 | Sellers | |
| 7,397,244 B2 | 7/2008 | Cirel | |
| 7,449,889 B1 | 11/2008 | Huang et al. | |
| 7,475,552 B2 | 1/2009 | Sorsby | |

(Continued)

FOREIGN PATENT DOCUMENTS

| | | |
|---|---|---|
| GB | 2335973 A | 10/1999 |
| GB | 2420910 A | 6/2006 |

(Continued)

OTHER PUBLICATIONS

Search Report from corresponding GB Application No. GB1117851.4 dated Feb. 9, 2012.
Search Report from corresponding GB Application No. GB1117851.4 dated Jun. 25, 2012.

*Primary Examiner* — Stanley Silverman
*Assistant Examiner* — Kallambella Vijayakumar
(74) *Attorney, Agent, or Firm* — The Small Patent Law Group; Dean D. Small

(57) ABSTRACT

A superconducting magnet coil support with cooling and a method for coil cooling are provided. One superconducting coil support arrangement includes a superconducting coil and at least one support beam supporting the superconducting coil and defining a tank for storing a cooling fluid therein. The superconducting coil support arrangement further includes a plurality of cooling tubes coupled to the superconducting coil and connected to the at least one support beam, wherein the plurality of cooling tubes are configured to transfer the cooling fluid therethrough.

21 Claims, 11 Drawing Sheets

(56) References Cited

U.S. PATENT DOCUMENTS

| | | | |
|---|---|---|---|
| 7,786,730 B2 | 8/2010 | Aubert | |
| 7,812,604 B2 | 10/2010 | Icoz et al. | |
| 7,859,375 B2 * | 12/2010 | Atkins et al. | 335/216 |
| 7,868,617 B2 | 1/2011 | Seeber et al. | |
| 7,990,143 B2 | 8/2011 | Aubert | |
| 2005/0150242 A1 | 7/2005 | Frank et al. | |

FOREIGN PATENT DOCUMENTS

| | | | | |
|---|---|---|---|---|
| GB | 2422654 A | | 8/2006 | |
| GB | 2424468 A | | 9/2006 | |
| GB | 2426630 | * | 11/2006 | ......... G01R 33/3815 |
| GB | 2426630 A | | 11/2006 | |
| GB | 2451708 A | | 2/2009 | |
| GB | 2476559 A | | 6/2011 | |
| WO | 03098645 A1 | | 11/2003 | |

* cited by examiner

SUPERCONDUCTING MAGNET COIL SUPPORT WITH COOLING AND METHOD FOR COIL-COOLING

BACKGROUND OF THE INVENTION

The subject matter disclosed herein relates generally to superconducting magnets, and more particularly to systems and methods for cooling superconducting magnets.

Superconducting coils, for example superconducting coils forming Magnetic Resonance Imaging (MRI) magnets, are cryogenically cooled using a helium reservoir. The cryogen cooling system of some of these MRI systems include a coldhead that operates to recondense vaporized cryogen to continually cool the superconducting magnet coils during system operation.

Additionally, these MRI magnets can experience large axial and radial electromagnetic (EM) forces during coil energization. In MRI systems, the magnet coils can be self-supporting in the radial direction. However, in the axial direction, because of the significant inter-coil forces, the magnet coils need to have support at the coil flanges through the interface with a support structure (e.g., coil former).

When the magnet coils are expanding radially, such as during energization, frictional heat is generated and released due to stick-slip motion between the coil support and the magnet coils. The generated heat can overheat a localized area of the coil and create a normal zone, where the conductor loses superconducting property and transfers to a normal resistive state. The normal zone will spread through the coil due to the Joule heat and the thermal conduction, which results in a quench event. The quench is accompanied by the rapid boil-off of helium escaping from the cryogen bath in which the magnet coils are immersed. Each quench, followed by the re-fill and re-ramp of the magnet, is an expensive and time consuming event.

Different devices and methods have been used to cool the coils during start-up and steady state operation. For example, different conduction cooling methods have been used. However, these conduction cooling methods are inefficient.

BRIEF DESCRIPTION OF THE INVENTION

In accordance with various embodiments, a superconducting coil support arrangement is provided that includes a superconducting coil and at least one support beam supporting the superconducting coil and defining a tank for storing a cooling fluid therein. The superconducting coil support arrangement further includes a plurality of cooling tubes coupled to the superconducting coil and connected to the at least one support beam, wherein the plurality of cooling tubes are configured to transfer the cooling fluid therethrough.

In accordance with other embodiments, a multi-stage cooling arrangement for a superconducting magnet is provided. The multi-stage cooling arrangement includes a plurality of liquid cooling tanks having cooling liquid therein, a plurality of cooling tubes coupled to coils of the superconducting magnet and a coldhead configured to recondense boiled-off cooling liquid. The multi-stage cooling arrangement further includes a thermal shield and a fluid divider connected between the plurality of cooling tubes and (i) directly to the coldhead or (ii) to the coldhead through the thermal shield.

In accordance with yet other embodiments, a method for cooling coils of a superconducting magnet is provided. The method includes coupling a plurality of cooling tubes to coils of the superconducting magnet and forming at least one coil support having a cooling fluid tank therein and configured to support the coils of the superconducting magnet.

DETAILED DESCRIPTION OF THE INVENTION

Figure 1:
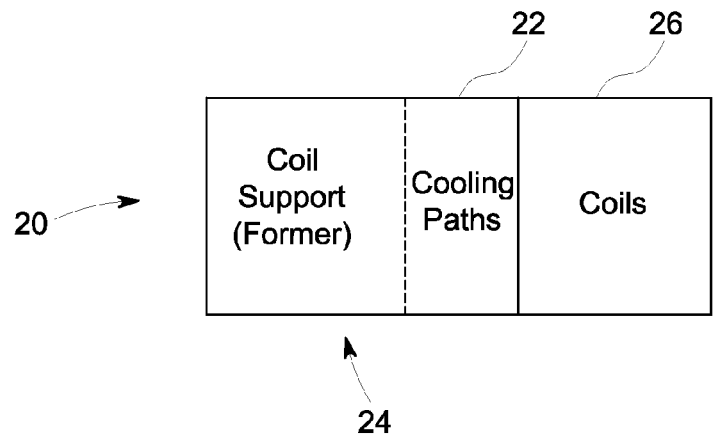
FIG. 1 is a simplified block diagram of an integrated former with cooling for a superconducting coil magnet formed in accordance with various embodiments.

The foregoing summary, as well as the following detailed description of certain embodiments, will be better understood when read in conjunction with the appended drawings. To the extent that the figures illustrate diagrams of the functional blocks of various embodiments, the functional blocks are not necessarily indicative of the division between hardware. Thus, for example, one or more of the functional blocks may be implemented in a single piece of hardware or multiple pieces of hardware. It should be understood that the various embodiments are not limited to the arrangements and instrumentality shown in the drawings.

As used herein, an element or step recited in the singular and proceeded with the word "a" or "an" should be understood as not excluding plural of said elements or steps, unless such exclusion is explicitly stated. Furthermore, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

Various embodiments provide systems and methods for cooling superconducting magnets, particularly reducing heat generated by the coils of superconducting magnets, such as during energization or steady state operation thereof. By practicing at least one of the embodiments, a less complex magnet cooling arrangement is provided that reduces the likelihood of loss of helium (e.g., during boil-off) and the cost thereof.

Various embodiments include a thermo-siphon cooling/ heat exchange arrangement that cools the coils of a superconducting magnet. In superconducting magnets for a Magnetic Resonance Imaging (MRI) system having helium-cooled coils, the thermo-siphon arrangement in various embodiments uses convention and conduction cooling. A coil support structure is also used as part of the cooling loop, with boiled-off helium gas used to cool down the system, including the thermal shield, with the boiled-off helium also recondensed to liquid helium.

It should be noted that although some embodiments may be described in connection with superconducting magnets for MRI systems, the various embodiments may be implemented in connection with any type of system having superconducting magnets. The superconducting magnets may be implemented in other types of medical imaging devices, as well as non-medical imaging devices.

As shown in FIG. 1, a cooling arrangement 20 for cooling a superconducting magnet formed in accordance with various embodiments includes cooling paths 22 (e.g., cooling loops) provided in combination with a coil support 24 (e.g., coil former). The coil support 24 is shaped and sized to support one or more coils 26 of the superconducting magnet. The coil support 24 may be, for example, an integrated former with cooling. Accordingly, the coil support 24 provides structural support for the one or more coils 26, such as support from axial and radial forces, and also a cooling path for cooling the one or more coils 26.

Figure 2:
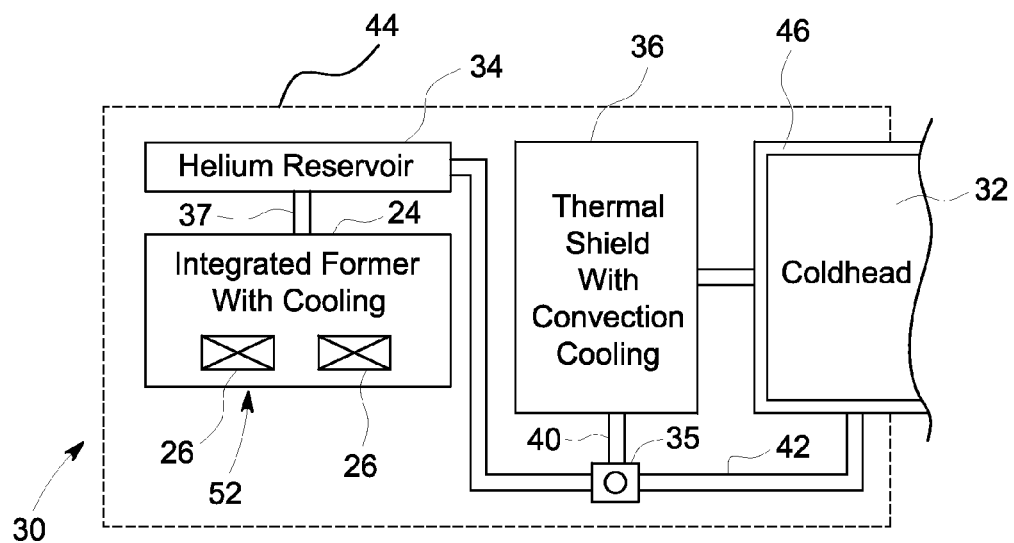
FIG. 2 is a simplified block diagram of a magnetic resonance imaging (MRI) magnet system illustrating a cooling arrangement formed in accordance with various embodiments.
Figure 3:
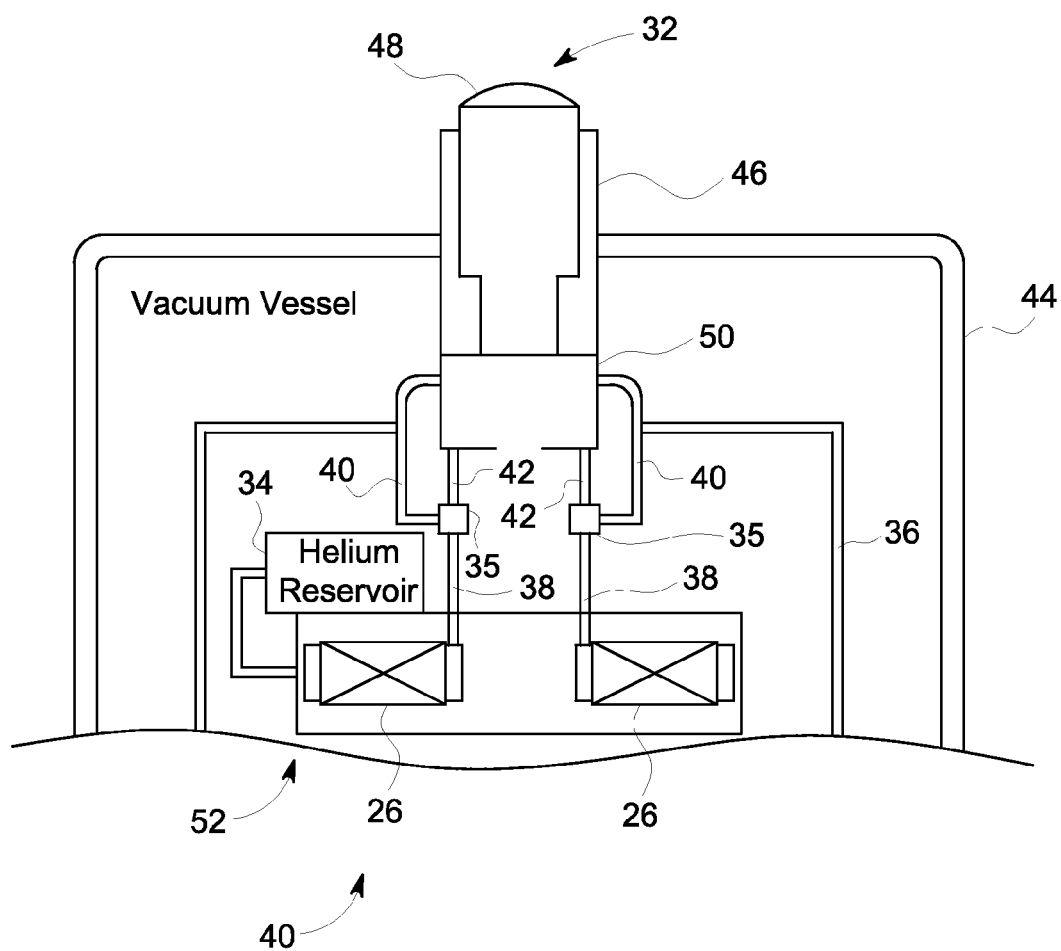
FIG. 3 is a diagrammatic illustration of an MRI magnet system illustrating a cooling arrangement formed in accordance with various embodiments.

The various embodiments may be implemented as part of an MRI magnet system 30 as illustrated in FIGS. 2 and 3, wherein the cooling is provided via a two stage thermo-siphon cooling arrangement. It should be noted that like numerals represent like parts throughout the Figures.

In particular, two paths are provided to transfer fluid, in particular helium, to a coldhead 32 of the magnet system 30. In this embodiment, a fluid divider 35 is used to control the fluid flow between a first stage and a second stage. The fluid divider 35 connects a helium reservoir 34, and in particular, the cooling paths 22 (shown in FIG. 1) of the coil support 24 (e.g., integrated former) having the helium reservoir 34, to a thermal shield 36 and the coldhead 32. The helium reservoir 34 may be formed from one or more tanks (which may be liquid or gas tanks) as described herein and that form part of the coil support 24 (e.g., integrated former) with one or more passageways 37. As described in more detail herein, the thermal shield 36 includes a convection cooling arrangement.

The vessel 34 of the MRI magnet system 30 holds a liquid cryogen, such as liquid helium. The helium reservoir 34 is also surrounded by a vacuum vessel 44 that includes the thermal shield 36 therein and/or therebetween. The thermal shield 36 may be, for example, a thermally isolating radiation shield with convection cooling as described herein.

The coldhead 32, which in various embodiments is a cryocooler, extends through the vacuum vessel 44 within a coldhead sleeve 46 (e.g., a housing). Thus, the cold end of the coldhead 32 may be positioned within the coldhead sleeve 46 without affecting the vacuum within the vacuum vessel 44.

The coldhead 32 is inserted (or received) and secured within the coldhead sleeve 46 using any suitable means, such as one or more flanges and bolts, or other means known in the art. Moreover, a motor 48 of the coldhead 28 is provided outside the vacuum vessel 24.

The coldhead sleeve 46 includes an open end into the helium reservoir 34. As illustrated in FIG. 3, the coldhead 32 in various embodiments includes a recondenser 50 at a lower end of the coldhead 32 having a portion thereof that extends into the helium reservoir 34 through the open end when the coldhead 32 is inserted and received within the coldhead sleeve 46. The recondenser 50 recondenses boiled off helium gas from the helium reservoir 34. The recondenser 50, which is coupled to the helium reservoir 34 via the one or more passageways 38, 40 and 42 allows for transferring boiled off helium gas from the helium reservoir 34 to the recondenser 50, which then may transfer back recondensed helium liquid to the helium reservoir 34.

A superconducting magnet 52, which in various embodiments is a superconducting magnet formed from the one or more coils 26, is provided inside the helium reservoir 34 and is controlled during operation of the MRI system as described in more detail herein to acquire MRI image data. Additionally, during operation of the MRI system, liquid helium within the helium reservoir 34 of the MRI magnet system 30 cools the superconducting magnet 52, which may be configured as a coil assembly as is known. The superconducting magnet 52 may be cooled, for example, to a superconducting temperature, such as 4.2 Kelvin (K). The cooling process may include the recondensing of boiled off helium gas to liquid by the recondenser 50 and returned to the helium reservoir 34.

Referring specifically to the two stage cooling arrangement, as illustrated, the fluid pathway 38 connects the cooling paths 22 of the coil support 24 with the fluid divider 35, which is operable to control the amount of helium fluid that is transferred to the thermal shield 36 and/or the coldhead 32. The fluid divider 35 may be a multi-channel valve having two outputs with the fluid pathway 40 connecting the fluid divider 35 to the thermal shield 36 and the fluid pathway 42 connecting the fluid divider 35 to the coldhead 32. It should be noted that in FIG. 3, the fluid pathways 38, 40 and 42 may be formed from multiple pathways (illustrated as two pathways each).

Thus, in operation, the two path cooling arrangement distributes and controls the amount and flow of helium fluid between the first stage (thermal shield stage) and the second stage (to the coldhead 32). Accordingly, in the first stage, helium gas from the cooling paths 22 is first cooled by the thermal shield 36 and then recondensed by the coldhead 32. In the second stage, helium gas from the cooling paths 22 is recondensed directly by the coldhead 32 without first passing through the thermal shield 36.

It should be noted that the amount of helium fluid transferred to and/or between the thermal shield 36 and/or the coldhead 32 by the fluid divider 35 may be varied as desired or needed. For example, a portion of the helium fluid may be directed to both the thermal shield 36 and the coldhead 32 in equal or unequal percentages, entirely to the thermal shield 36 or entirely to the coldhead 32. The selective operation of the fluid divider 35 may be controlled automatically or manually. Additionally, the amount of helium fluid directed to the thermal shield 36 and the coldhead 32 may be dynamically adjusted.

Figure 4:
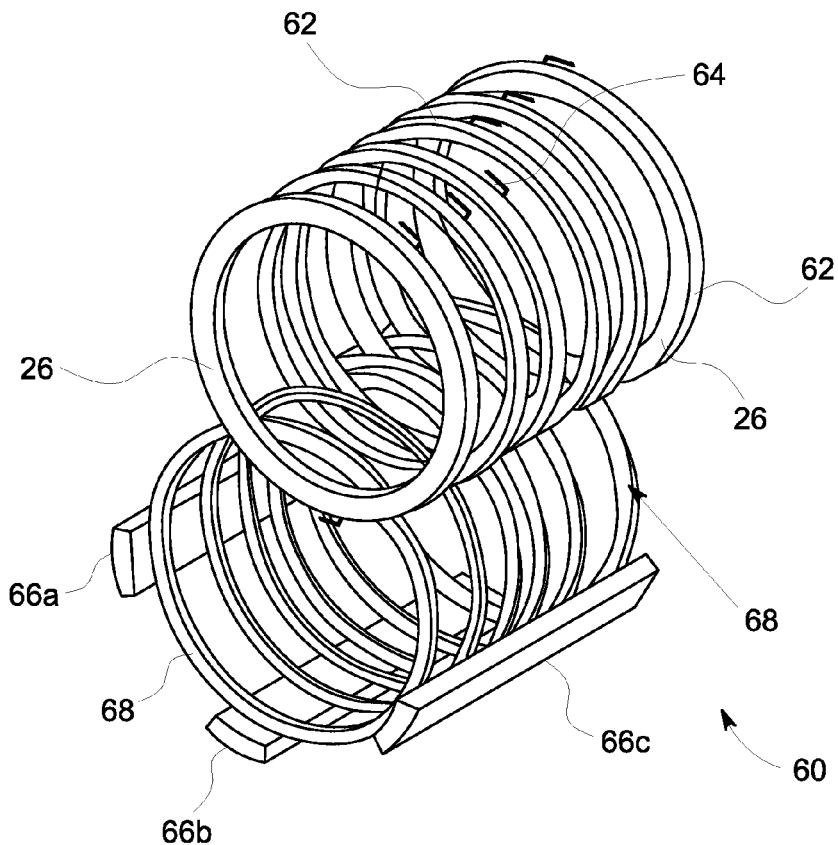
FIG. 4 is an exploded perspective view of an integrated former with cooling formed in accordance with various embodiments.
Figure 5:
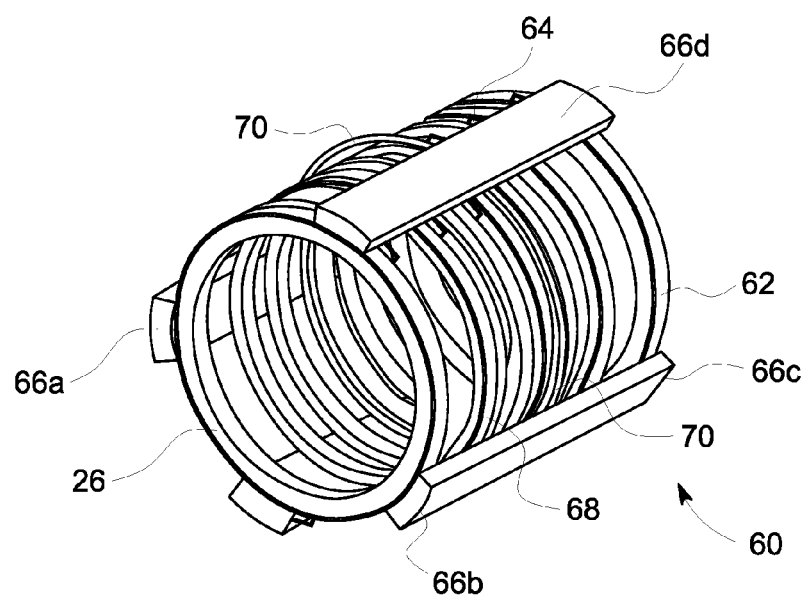
FIG. 5 is a perspective view of an integrated former with cooling formed in accordance with various embodiments.
Figure 6:
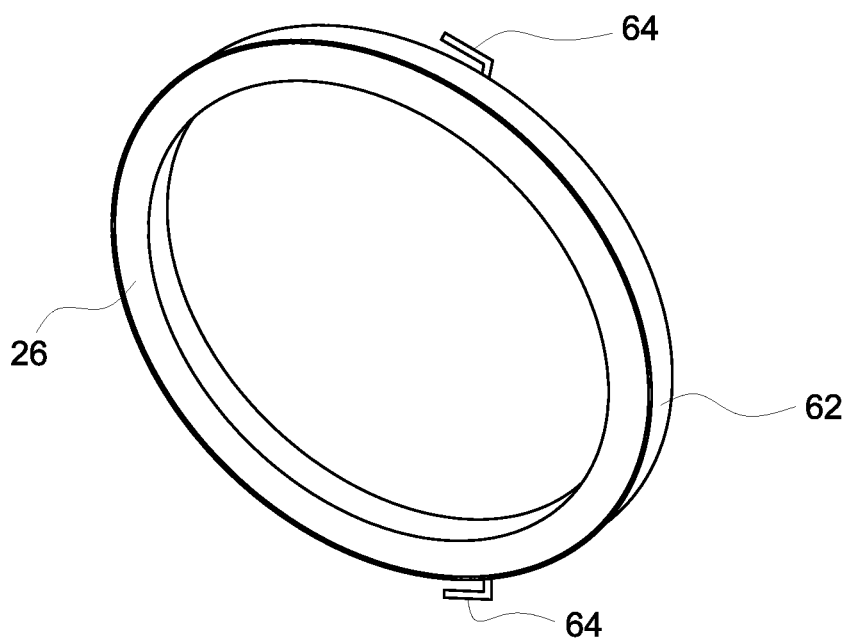
FIG. 6 is a perspective view of a single coil having a cooling tube formed in accordance with various embodiments.

An integrated former 60 formed in accordance with various embodiments having cooling is illustrated in FIGS. 4 through 6. The integrated former 60 includes a plurality of cooling tubes 62 provided in thermal connection with the plurality of coils 26 forming the magnet 52. In the illustrated embodiment, a cooling tube 62 is wound around and coupled to each of the plurality of coils 26 as shown more clearly in FIG. 6 (illustrated as a single coil 26). The cooling tubes 62 may be formed of any suitable material, such as a metal (e.g., copper, stainless steel, aluminum, etc.) and coupled to the outer circumference of the coil 26 using a suitable fastening means, such as a mechanical fastener (e.g., bolt) or adhesive (e.g., thermal epoxy). The cooling tubes 62 also may be formed having different shapes and sizes.

The cooling tubes 62 also include one or more ports 64 (e.g., an inlet port and outlet port are illustrated). The ports 64 allow for fluid to enter and exit each of the cooling tubes 62 to provide fluid flow through the cooling tubes 62. The ports 64 also allow for interconnection between the plurality of cooling tubes 62 corresponding to the plurality of coils 26.

The integrated former 60 also includes a plurality of laterally extending supports 66 (e.g., support beams) to which the plurality of coils 26 with cooling tubes 62 are coupled. For example, four spaced apart supports 66 may be provided to define a coil assembly or cartridge. In some embodiments, the supports 66 are hollow beams formed from a suitable material (e.g., metal) and may be coupled to the plurality of coils 26. For example, in the embodiment shown, three of the supports 66*a-c* (as illustrated in FIG. 4) may be coupled to the plurality of coils 26 using a groove or interference fit. The last support 66*d* may be coupled to the plurality of coils 26 in a different or additional manner to provide more secure and permanent attachment, such as by welding.

The ports 64 of each of the cooling tubes 62 may be configured for connection to one or more of the supports 66, for example, the supports 66*a-c* (as illustrated in FIG. 5), which define liquid tanks. Thus, a fluid pathway is provided from the cavities within the hollow supports 66*a*, 66*b* and 66*c* (defining liquid tanks), through the cooling tubes 62 and back to the support 66*d* (defining a gas tank). The hollow supports 66*a*-66*d* defining the tanks in various embodiments forms the helium reservoir 34 (shown in FIG. 2).

The integrated former 60 also may includes another set of cooling tubes 68, which may be charger lines or a closed cooling system. The cooling tubes 68 in the illustrated embodiment are connected to a different cooling system that may include a different fluid or may be connected to a different support. The cooling tubes 68 may operate as pre-cooling tubes that circulate a different fluid (e.g., liquid nitrogen ($LN_2$)) than the cooling tubes 62, and may be configured to be adjacent to or abut the coils 26.

For example, the cooling tubes 62 may circulate boiled-off helium from the MRI system as described in more detail herein. The cooling tubes 68, which may be pre-cooling tubes, may circulate liquid nitrogen and are used as a reservoir to store thermal energy, for example, to absorb and transfer heat from the plurality of coils 26 before the helium flowing through the cooling tubes 62 absorbs and transfers heat. The cooling tubes 62 may be filled with a high heat capacity cryogen such that a thermal battery is formed to improve heat transfer. It should be noted that the supports 66 may define different tanks having different fluids or gasses therein and connected to different cooling tubes.

Additional structural supporting members may be provided. For example, a plurality of spaced apart circumferentially extending supports 70 may be connected between the support beams 66. It also should be noted that the cooling tubes 68 may be formed in a rigid manner to provide for aligning and axially supporting (e.g., operating as stoppers) the plurality of coils 26.

Figure 7:
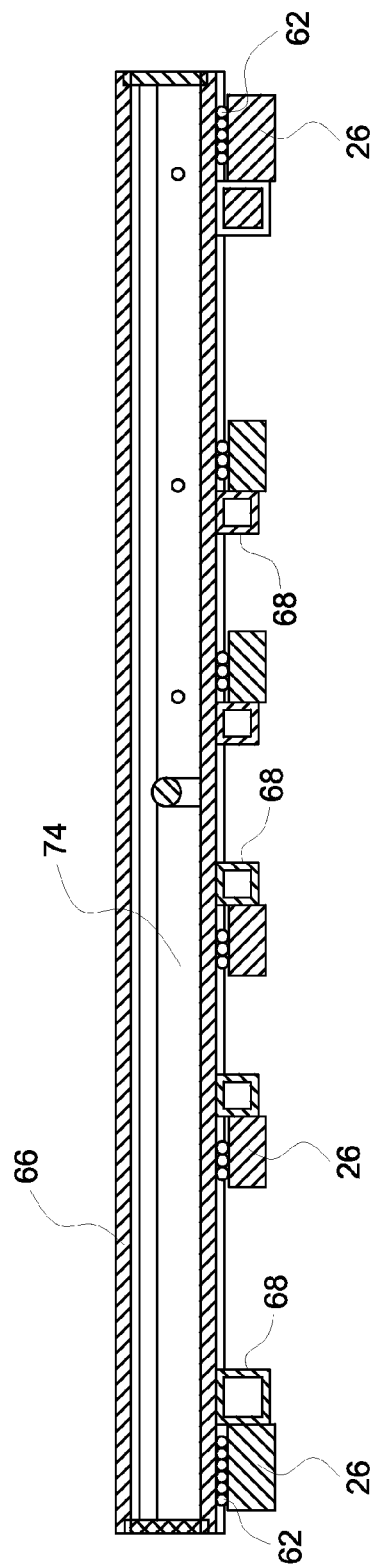
FIG. 7 is a cross-sectional view of the integrated former of FIGS. 5 and 6.

Thus, as shown in FIG. 7, illustrating a six coil 26 configuration, the cooling tubes 62 are provided around the outer circumference of the coils 26 and coupled to the support beam 66 using an adhesive (e.g., glue). FIG. 7 also more clearly shows the cavity 74 within the support beam 66.

Figure 8:
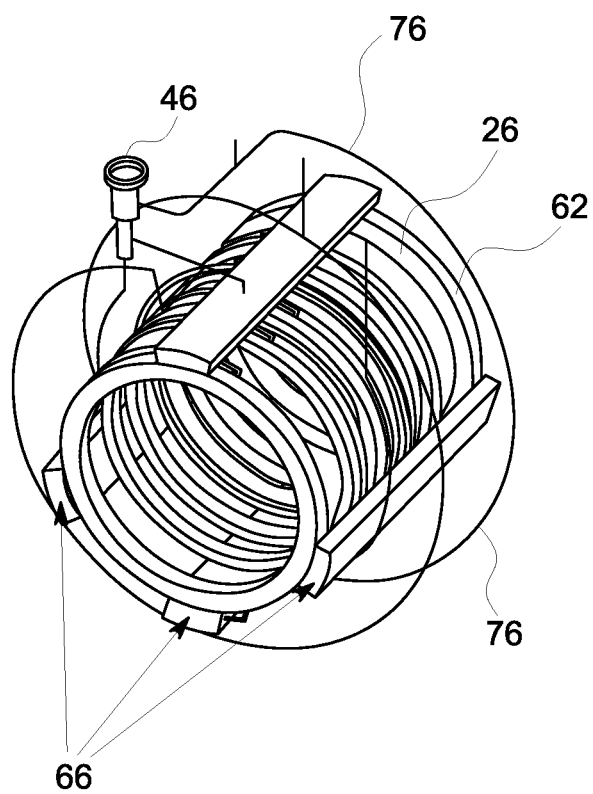
FIG. 8 is a perspective view of an integrated former illustrating cooling paths formed in accordance with various embodiments.
Figure 9:
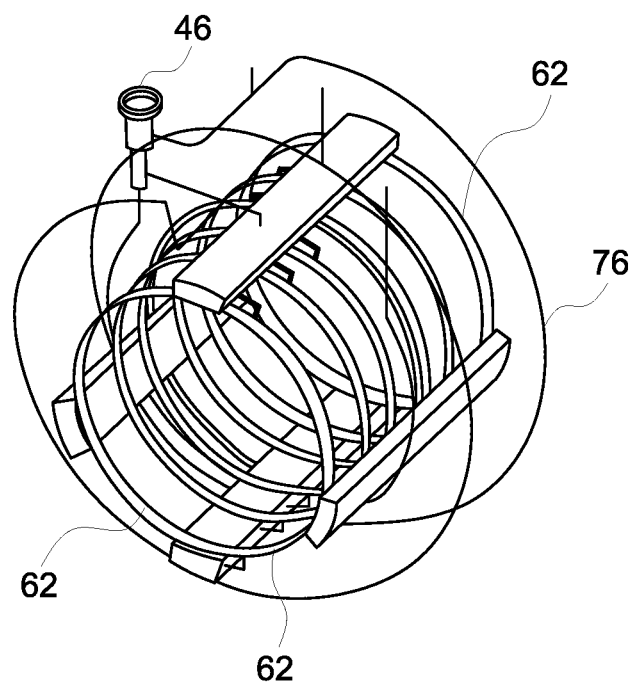
FIG. 9 is a perspective view of an integrated former illustrating cooling paths formed in accordance with various embodiments with the coils removed.
Figure 10:
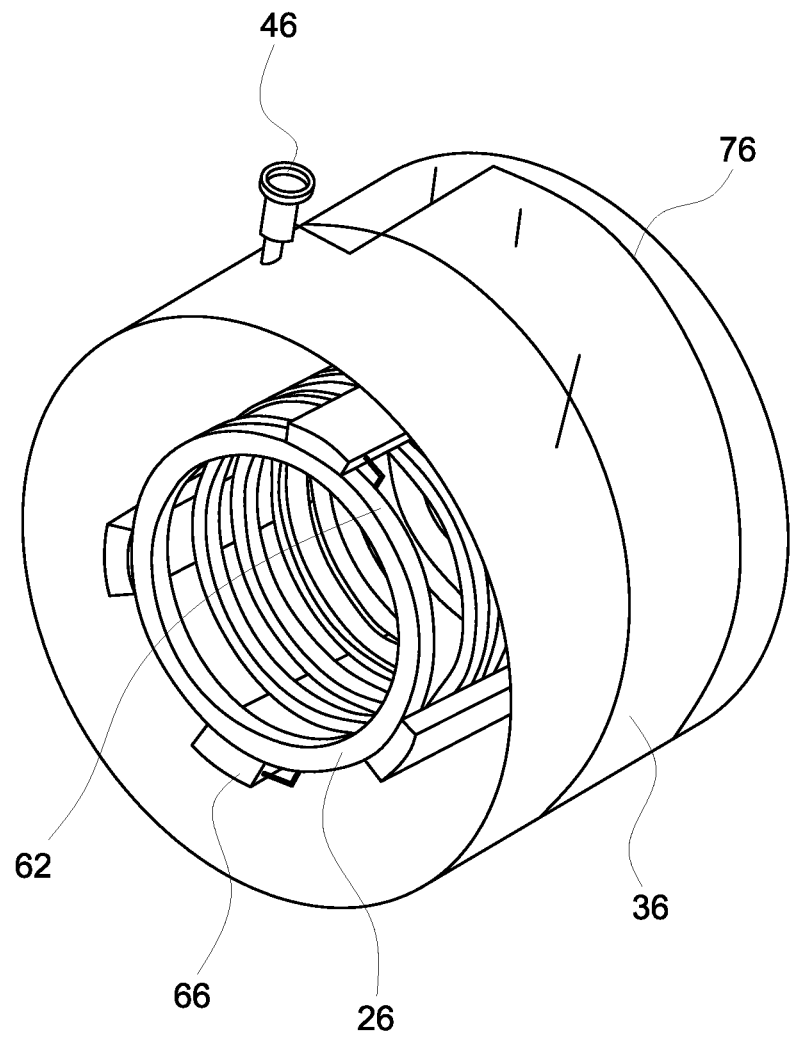
FIG. 10 is a perspective view of an integrated former illustrating a thermal shield formed in accordance with various embodiments.

As illustrated in FIGS. 8 and 9, an additional cooling pathway may be provided by one or more circumferentially extending cooling tubes 76, which may extend around the circumference of the thermal shield 36 (as illustrated in FIG. 10). The cooling tubes 76 also may be connected to one or more of the support beams 66, for example, the support beams 66*b* and 66*d*, such that helium flows therethrough. A port (not shown), which may be configured as a supply port (e.g., $LN_2$ pre-cooling port) also may be connected to the cooling tubes 76 to supply cooling fluid or remove cooling fluid from the cooling arrangement. Thus, the thermal shield 36 operates using convection cooling, which may simplify the design of the coldhead sleeve 46, as well as allow the thermal shield 36 to be thinner.

Figure 11:
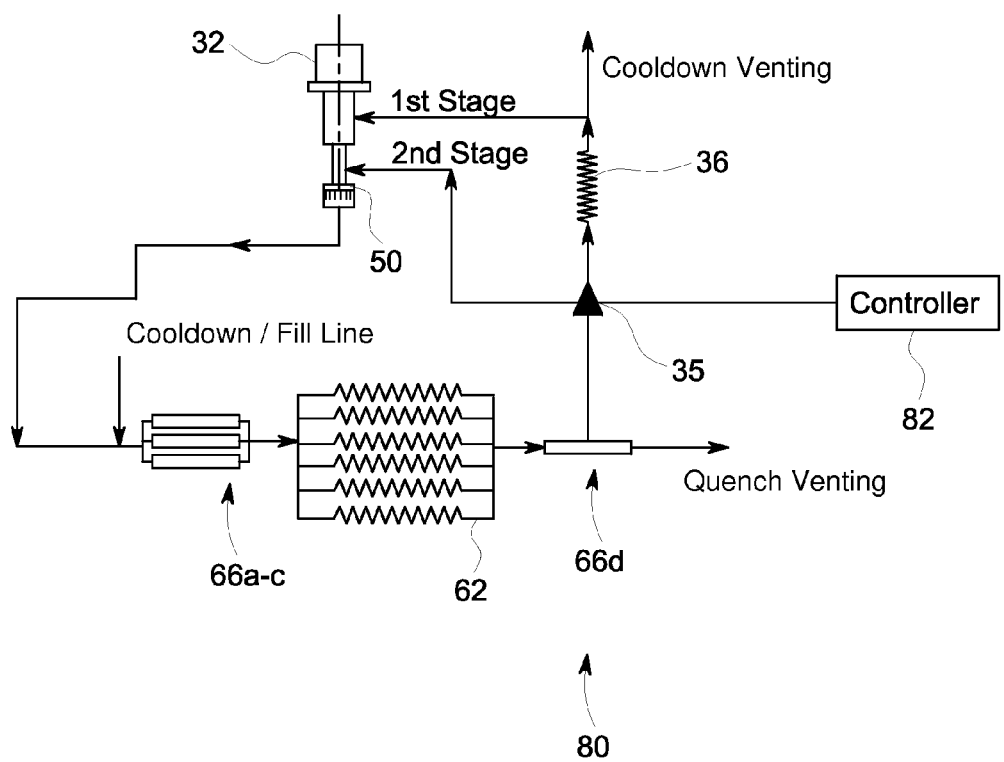
FIG. 11 is a schematic block diagram of a thermo-siphon cooling loop formed in accordance with various embodiments.

The various embodiments may provide a thermo-siphon cooling arrangement 80 as shown in FIG. 11. The thermo-siphon cooling arrangement 80 may define a thermo-siphon cooling loop or system wherein helium flows through the supports 66*a-c* (defining liquid tanks) and then into and through the cooling tubes 62 around the coils 26. Heat is removed therefrom and the liquid helium becomes helium gas, which may be vented (e.g., quench venting). Additionally, the helium gas is directed to one of the thermal shield 36 to define the first stage and/or directly to the recondenser 50 to define the second stage. Cool down/venting from the thermal shield 36 also is provided. It also should be noted that the coldhead 32 does not include a coldhead sleeve 46 in the illustrated embodiment.

Additionally, a controller 82 is provided that controls the amount of fluid flowing to each of the first and second stages. The controller 82 may automatically control the amount of fluid flowing to each of the first and second stages, such as based on a measured temperature of the coils 26 or an operating condition of the MRI system (e.g., coil energization or steady state).

In a ride-through condition or at a time where the coldhead 32 needs to be switched off, the coldhead 32 and the coldhead sleeve 46 may add an unwanted parasitic heat load to the cryostat. Accordingly, in various embodiments, the fluid divider 35 is driven by the controller 82 to optimally distribute the flow across the thermal shield 36 and via the second stage of the coldhead 32.

A cooling arrangement for a superconducting magnet, such as in an MRI system, is thereby provided in accordance with various embodiments. The cooling arrangement includes an integrated former with cooling, as well as optionally convention cooling on the thermal shield. Additionally, a two stage controllable cooling configuration is provided.

Figure 12:
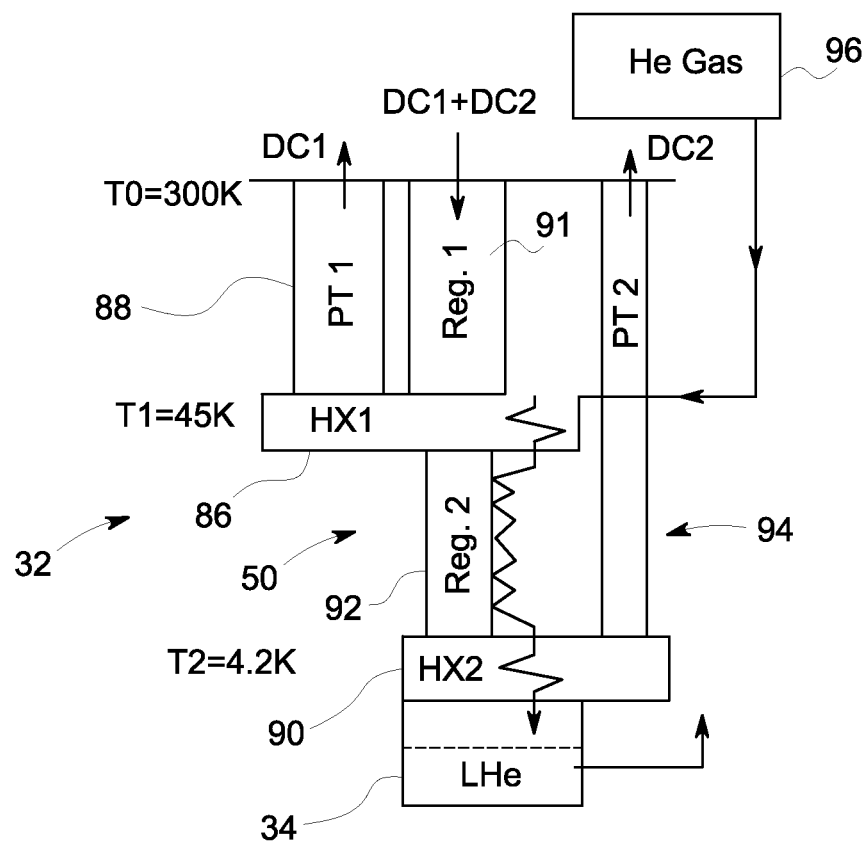
FIG. 12 is a block diagram illustrating a coldhead receiving a gas supply from a thermal shield in accordance with various embodiments.

FIG. 12 illustrates the coldhead 32 receiving a gas supply (e.g., boiled off helium gas) from the thermal shield 36 (shown in FIG. 2). For example, the coldhead 32 may be of the pulse tube cooler type or a 4 K Gifford-McMahon (GM) type coldhead. In this configuration, a tube 84 receiving the exchange gas from the thermal shield 36 can be efficiently used for helium gas pre-cool, and thus increases the liquefaction rate. As illustrated, a heat exchanger 86 surrounds a first stage 88 of the cryocooler arrangement (that includes a regenerator tube 91) and a heat exchanger 90 surrounds a regenerator tube 92 of a second stage 94 of the cryocooler arrangement towards the thermal shield 36. Thus, helium gas 96 may be introduced to the first stage 88 from the thermal shield 36.

The communicated helium gas 96 then may be cooled with the recondenser 50 by exchanging heat as described herein. For example, using thermal contact with the regenerator tube 92, heat may be exchanged and the helium gas 96 recondensed by the recondenser 50.

The various embodiments may be implemented in connection with different types of superconducting coils, such as superconducting coils for an MRI system. For example, the various embodiments may be implemented with superconducting coils for use with an MRI system 100 shown in FIG. 13. It should be appreciated that although the system 100 is illustrated as a single modality imaging system, the various embodiments may be implemented in or with multi-modality imaging systems. The system 100 is illustrated as an MRI imaging system and may be combined with different types of medical imaging systems, such as a Computed Tomography (CT), Positron Emission Tomography (PET), a Single Photon Emission Computed Tomography (SPECT), as well as an ultrasound system, or any other system capable of generating images, particularly of a human. Moreover, the various embodiments are not limited to medical imaging systems for imaging human subjects, but may include veterinary or non-medical systems for imaging non-human objects, luggage, etc.

Figure 13:
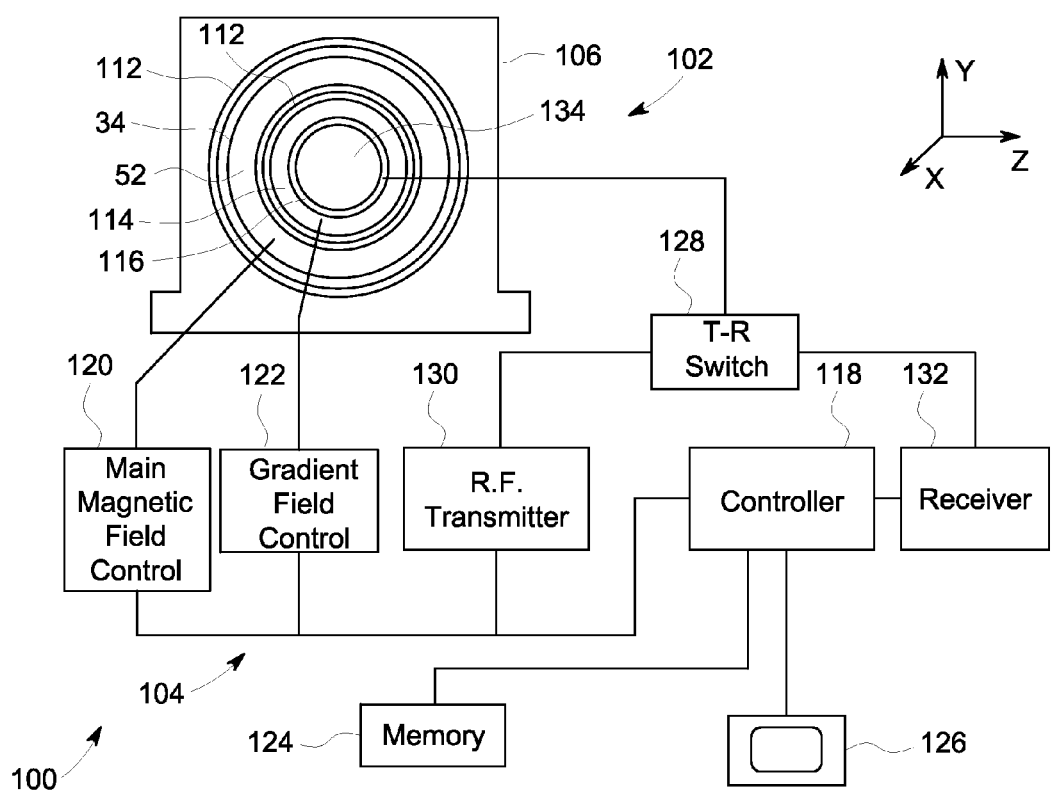
FIG. 13 is a pictorial view of an MRI system in which a cooling arrangement formed in accordance with various embodiments may be implemented.

Referring to FIG. 13, the MRI system 100 generally includes an imaging portion 102 and a processing portion 104 that may include a processor or other computing or controller device. The MRI system 100 includes within a gantry 106 a superconducting magnet 52 formed from coils, for example, coils supported on a former with cooling as described herein. The helium reservoir 34 (which may be a vessel and also referred to as a cryostat) surrounds the superconducting magnet 52 and is filled with liquid helium. The liquid helium may be used to cool the coils of the superconducting magnet 52, which includes providing the liquid helium to cooling tubes as described in more detail herein. Thermal insulation 112 is provided surrounding the outer surface of the helium reservoir 34 and the inner surface of the superconducting magnet 52. A plurality of magnetic gradient coils 114 are provided inside the superconducting magnet 52 and an RF transmit coil 116 is provided within the plurality of magnetic gradient coils 114. In some embodiments, the RF transmit coil 116 may be replaced with a transmit and receive coil. The components within the gantry 106 generally form the imaging portion 102. It should be noted that although the superconducting magnet 52 is a cylindrical shape, other shapes of magnets can be used.

The processing portion 104 generally includes a controller 118, a main magnetic field control 120, a gradient field control 122, a memory 124, a display device 126, a transmit-receive (T-R) switch 128, an RF transmitter 130 and a receiver 132.

In operation, a body of an object, such as a patient or a phantom to be imaged, is placed in the bore 134 on a suitable support, for example, a patient table. The superconducting magnet 108 produces a uniform and static main magnetic field $B_o$ across the bore 134. The strength of the electromagnetic field in the bore 134 and correspondingly in the patient, is controlled by the controller 118 via the main magnetic field control 120, which also controls a supply of energizing current to the superconducting magnet 52.

The magnetic gradient coils 114, which include one or more gradient coil elements, are provided so that a magnetic gradient can be imposed on the magnetic field $B_o$ in the bore 134 within the superconducting magnet 108 in any one or more of three orthogonal directions x, y, and z. The magnetic gradient coils 114 are energized by the gradient field control 122 and are also controlled by the controller 118.

The RF transmit coil 116, which may include a plurality of coils, is arranged to transmit magnetic pulses and/or optionally simultaneously detect MR signals from the patient if receive coil elements are also provided, such as a surface coil configured as an RF receive coil. The RF receive coil may be of any type or configuration, for example, a separate receive surface coil. The receive surface coil may be an array of RF coils provided within the RF transmit coil 116.

The RF transmit coil 116 and the receive surface coil are selectably interconnected to one of the RF transmitter 130 or receiver 132, respectively, by the T-R switch 128. The RF transmitter 130 and T-R switch 128 are controlled by the controller 118 such that RF field pulses or signals are generated by the RF transmitter 130 and selectively applied to the patient for excitation of magnetic resonance in the patient. While the RF excitation pulses are being applied to the patient, the T-R switch 128 is also actuated to disconnect the receive surface coil from the receiver 132.

Following application of the RF pulses, the T-R switch 128 is again actuated to disconnect the RF transmit coil 116 from the RF transmitter 130 and to connect the receive surface coil to the receiver 132. The receive surface coil operates to detect or sense the MR signals resulting from the excited nuclei in the patient and communicates the MR signals to the receiver 132. These detected MR signals are in turn communicated to the controller 118. The controller 118 includes a processor (e.g., image reconstruction processor), for example, that controls the processing of the MR signals to produce signals representative of an image of the patient.

The processed signals representative of the image are also transmitted to the display device 126 to provide a visual display of the image. Specifically, the MR signals fill or form a k-space that is Fourier transformed to obtain a viewable image. The processed signals representative of the image are then transmitted to the display device 126.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments without departing from their scope. While the dimensions and types of materials described herein are intended to define the parameters of the various embodiments, they are by no means limiting and are merely exemplary. Many other embodiments will be apparent to those of skill in the art upon reviewing the above description. The scope of the various embodiments should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

This written description uses examples to disclose the various embodiments, including the best mode, and also to enable any person skilled in the art to practice the various embodiments, including making and using any devices or systems and performing any incorporated methods. The patentable scope of the various embodiments is defined by the claims, and may include other examples that occur to those skilled in the art. Such other examples are intended to be within the scope of the claims if the examples have structural elements that do not differ from the literal language of the claims, or the examples include equivalent structural elements with insubstantial differences from the literal languages of the claims.

What is claimed is:

1. A superconducting coil support arrangement comprising:
   a superconducting coil;
   a plurality of support beams supporting the superconducting coil, at least one of the support beams defining a liquid helium tank for storing liquid helium and at least one of the support defining a helium gas tank for storing helium gas; and
   a plurality of cooling tubes coupled to the superconducting coil and connected to at least one of the support beams, the plurality of cooling tubes configured to transfer the liquid helium therethrough.

2. The superconducting coil support arrangement of claim 1, wherein the superconducting coil comprises a plurality of coils and wherein the plurality of cooling tubes are coupled to an outer circumference of the plurality of coils.

3. The superconducting coil support arrangement of claim 1, wherein at least one of the plurality of support beams is a non-tank support beam.

4. The superconducting coil support arrangement of claim 1, further comprising a plurality of pre-cooling tubes separate from the cooling tubes and having a cooling fluid flowing therethrough.

5. The superconducting coil support arrangement of claim 4, wherein the cooling fluid in the pre-cooling tubes is a non-helium liquid.

6. The superconducting coil support arrangement of claim 4, wherein the plurality of pre-cooling tubes comprise rigid tubes configured to align the superconducting coil along the at least one of the plurality of support beams.

7. The superconducting coil support arrangement of claim 1, further comprising a thermal shield and a plurality of thermal shield cooling tubes surrounding a circumference of the thermal shield.

8. The superconducting coil support arrangement of claim 1, wherein the plurality of cooling tubes are connected to a recondenser of a coldhead, and wherein the coldhead comprises one of a pulse tube cooler type coldhead or a 4K Gifford-McMahon (GM) type coldhead.

9. The superconducting coil support arrangement of claim 1, wherein at least one of the support beams is interference fit with the superconducting coil and at least one of the support beams is permanently coupled to the superconducting coil.

10. A superconducting coil support arrangement comprising:
    a superconducting coil;
    at least one support beam supporting the superconducting coil and defining a tank for storing a cooling fluid therein;
    a plurality of cooling tubes coupled to the superconducting coil and connected to the at least one support beam, the plurality of cooling tubes configured to transfer the cooling fluid therethrough; and
    a fluid divider selectively connecting the plurality of cooling tubes to at least one of (i) a recondenser of a coldhead through the thermal shield cooling tubes or (ii) directly to the recondenser to control an amount of cooling fluid flowing to the recondenser through the thermal shield cooling tubes and flowing directly to the recondenser.

11. A multi-stage cooling arrangement for a superconducting magnet, the multi-stage cooling arrangement comprising:
    a plurality of liquid cooling tanks having cooling liquid therein;
    a plurality of cooling tubes coupled to coils of the superconducting magnet;
    a coldhead configured to recondense boiled-off cooling liquid;
    a thermal shield; and
    a fluid divider connected between the plurality of cooling tubes and (i) directly to the coldhead or (ii) to the coldhead through the thermal shield.

12. The multi-stage cooling arrangement of claim 11, further comprising at least one gas tank connected between the plurality of cooling tubes and the fluid divider.

13. The multi-stage cooling arrangement of claim 11, wherein the plurality of cooling tanks define structural supports for the coils of the superconducting magnet.

14. The multi-stage cooling arrangement of claim 11, wherein the plurality of cooling tubes are coupled to an outer circumference of the coils.

15. The multi-stage cooling arrangement of claim 11, further comprising a plurality of pre-cooling tubes adjacent the coils.

16. The multi-stage cooling arrangement of claim 11, further comprising a plurality of coils surrounding the thermal shield and configured for convection cooling.

17. The multi-stage cooling arrangement of claim 11, wherein the fluid divider defines a two stage cooling configuration within a thereto-siphon cooling loop.

18. The multi-stage cooling arrangement of claim 11, wherein the coils comprise magnetic resonance imaging (MRI) coils.

19. The multi-stage cooling arrangement of claim 11, wherein the fluid divider is configured to selectively control fluid flow.

20. A method for cooling coils of a superconducting magnet, the method comprising:
    coupling a plurality of cooling tubes to coils of the superconducting magnet;
    forming at least one coil support having a cooling fluid tank therein and configured to support the coils of the superconducting magnet; and
    coupling a plurality of cooling tubes to a thermal shield and providing a fluid divider connected to (i) the plurality of cooling tubes coupled to the coils of the superconducting magnet and (ii) the plurality of cooling tubes coupled to the thermal shield.

21. The method of claim 20, further comprising using the fluid divider to control an amount of cooling fluid flowing to each of (i) the plurality of cooling tubes coupled to the coils of the superconducting magnet and (ii) the plurality of cooling tubes coupled to the thermal shield.

* * * * *